US010804887B1

(12) United States Patent
Prasad

(10) Patent No.: US 10,804,887 B1
(45) Date of Patent: Oct. 13, 2020

(54) SLOW CLAMP CIRCUIT FOR BIPOLAR JUNCTION TRANSISTOR (BJT) BUFFERS

(71) Applicant: TEXAS INSTRUMENTS INCORPORATED, Dallas, TX (US)

(72) Inventor: Sudheer Prasad, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/584,529

(22) Filed: Sep. 26, 2019

(51) Int. Cl.
  *H03K 5/08* (2006.01)
  *H03K 17/082* (2006.01)
  *H03K 17/16* (2006.01)
  *H01L 27/02* (2006.01)

(52) U.S. Cl.
  CPC ............ *H03K 5/08* (2013.01); *H03K 17/0826* (2013.01)

(58) Field of Classification Search
  CPC .............................. H03K 5/08; H03K 17/0826
  See application file for complete search history.

(56) References Cited

U.S. PATENT DOCUMENTS

| | | | | |
|---|---|---|---|---|
| 5,212,618 A * | 5/1993 | O'Neill | ............... | H01L 27/0248 257/356 |
| 5,606,282 A * | 2/1997 | Yoshida | .................... | H03F 3/72 330/51 |
| 7,791,139 B2 * | 9/2010 | Wahl | ....................... | H01L 21/84 257/347 |
| 8,446,181 B2 * | 5/2013 | Keel | ....................... | H03F 3/082 327/91 |
| 8,729,823 B2 * | 5/2014 | Swamy | .................. | H05B 45/22 315/291 |
| 9,502,890 B2 * | 11/2016 | Zhan | ....................... | H02H 9/046 |
| 9,543,296 B2 * | 1/2017 | Vashchenko | ........ | H01L 27/0262 |
| 9,805,237 B2 * | 10/2017 | Feng | .................. | G06K 7/10851 |
| 10,211,199 B2 * | 2/2019 | Mallikarjunaswamy | ..................... | H01L 27/0255 |
| 10,249,609 B2 * | 4/2019 | Salcedo | .............. | H01L 27/0262 |
| 10,535,648 B2 * | 1/2020 | Chen | .................... | H01L 27/0664 |
| 2005/0083618 A1 * | 4/2005 | Steinhoff | ............ | H01L 27/0259 361/56 |
| 2012/0133025 A1 * | 5/2012 | Clarke | ................ | H01L 27/0259 257/570 |

* cited by examiner

*Primary Examiner* — Kenneth B Wells
(74) *Attorney, Agent, or Firm* — Ray A. King; Charles A. Brill; Frank D. Cimino

(57) ABSTRACT

A system includes: 1) a buffer circuit; 2) circuitry coupled to an input of the buffer circuit; 3) a load coupled to an output of the buffer circuit; and 4) a clamp circuit coupled between an input of the buffer circuit and the output of the buffer circuit. The clamp circuit includes: 1) a bipolar junction transistor (BJT); 2) a first resistor with a first end coupled to a base terminal of the BJT and with a second end coupled to a collector terminal of the BJT; and 3) a second resistor with a first end coupled to the collector terminal of the BJT and with a second end coupled to the input of the buffer circuit. The second resistor is between an output of the circuitry and the input of the buffer circuit.

21 Claims, 4 Drawing Sheets

SLOW CLAMP CIRCUIT FOR BIPOLAR JUNCTION TRANSISTOR (BJT) BUFFERS

BACKGROUND

The voltage levels and current levels in an electrical circuit are scaled up or scaled down as needed to account for mismatched circuit elements. For example, sense signals or control signals in an electrical circuit are often low power (low current) signals. In contrast, drive signals are higher power (higher current) signals. One example circuit to change voltage levels in an electrical circuit is referred to as a voltage regulator. Meanwhile, an example circuit to increase current while maintaining a voltage level is referred to as a voltage buffer.

An example voltage buffer architecture for high-speed bipolar junction transistor (BJT) designs is a class AB emitter-follower (e.g., a diamond structure). Under fault conditions like output short/thermal shut down, a large reverse voltage can develop across the off BJT drivers, which can exceed the reverse VBE (base-to-emitter voltage) rating of the device. Diode clamps with series resistance have been used to limit the input-output voltage difference. Older BJT processes had a relatively large reverse VBE rating (>6V) and hence a large string of diodes with a total clamping voltage of 5 or 6V was used. For modern high-speed BJT processes, the reverse VBE rating tends to be too small (<1V) and hence diode clamps tend to severely limit the output swing under slewing conditions.

SUMMARY

In accordance with at least one example of the disclosure, a system comprises a buffer circuit and circuitry coupled to an input of the buffer circuit. The system also comprises a load coupled to an output of the buffer circuit. The system also comprises a clamp circuit coupled between the input of the buffer circuit and the output of the buffer circuit. The clamp circuit comprises a bipolar junction transistor (BJT) and a first resistor with a first end coupled to a base terminal of the BJT and with a second end coupled to a collector terminal of the BJT. The clamp circuit also comprises a second resistor with a first end coupled to the collector terminal of the BJT and with a second end coupled to the input of the buffer circuit. The second resistor is between an output of the circuitry and the input of the buffer circuit.

In accordance with at least one example of the disclosure, a buffer device comprises an input node and an output node. The buffer device also comprises a buffer circuit coupled between the input node and the output node. The buffer device also comprises a clamp circuit coupled between the input node and the output of the buffer circuit. The clamp circuit comprises a BJT and a first resistor with a first end coupled to a base terminal of the BJT and with a second end coupled to a collector terminal of the BJT. The clamp circuit also includes a second resistor with a first end coupled to the collector terminal of the BJT and with a second end coupled to the input node. The second resistor is between the input node and an input of the buffer circuit.

In accordance with at least one example of the disclosure, an integrated circuit comprises an input node and output node. The integrated circuit also comprises a BJT buffer circuit coupled between the input node and the output node. The integrated circuit also comprises a clamp circuit coupled between the input node and the output of the buffer circuit. The clamp circuit is configured to delay clamping for at least a threshold amount of time using a BJT with a base resistor.

BRIEF DESCRIPTION OF THE DRAWINGS

For a detailed description of various examples, reference will now be made to the accompanying drawings in which.

DETAILED DESCRIPTION

Disclosed herein are slow clamp circuit topologies for use with a buffer circuit. As used herein, a "slow clamp circuit" refers to a clamp circuit with a turn-on delay that is at least twice the delay of a buffer circuit with which the clamp circuit is being used. For example, if a buffer input-to-output delay is 50 ns, a slow clamp circuit in use with the buffer has a turn-on delay of at least 100 ns. If a buffer input-to-output delay is 1 µs, a slow clamp circuit in use with the buffer has a turn-on delay of at least 2 µs.

In the disclosed examples, the slow clamp circuit topologies involve a Bipolar Junction Transistor (BJT) with a base resistor. The base resistor and the base-to-emitter capacitance of the BJT result in a clamping delay of at least a threshold amount of time (e.g., ~200 ns if a related buffer circuit delay is 100 ns or less). Also, a diode is placed between the collector and emitter of the BJT to prevent reverse voltage, where the diode is able to withstand a large reverse voltage. In some examples, the slow clamp circuit is used between the input node and the output node of a buffer circuit. In such case, the slow clamp circuit does not interfere with the slew rate of fast changing input signals at the input node of the buffer circuit. Under normal operating conditions, the signal at the output node of the buffer circuit will track the signal at the input node of the buffer circuit (the slow clamp circuit does not interfere). If a fault condition arises, the signal at the output node of the buffer circuit will no longer track the signal at the input node of the buffer circuit. Example fault conditions include the output being shorted to ground, a current limiter circuit becoming active, and a thermal shut down circuit becoming active. In the event of a fault condition, the slow clamp circuit is able to limit the difference between the voltage levels at the input node and the output node, which limits reverse VBE (base-to-emitter voltage) across the off transistor of the buffer circuit. In this manner, the buffer circuit is protected from damage due to reverse VBE.

In different examples, the level of clamping provided by the slow clamping circuit varies. Also, in different examples, the slow clamping circuit provides unidirectional clamping or bidirectional clamping. Also, in some examples, protection diodes are added across the base and emitter terminals of each output transistor of a buffer circuit. Also, in different examples, the turn-on delay of a slow clamp circuit varies. To provide a better understanding, various slow clamp circuit options and related systems or devices are described using the figures as follows.

Figure 1:
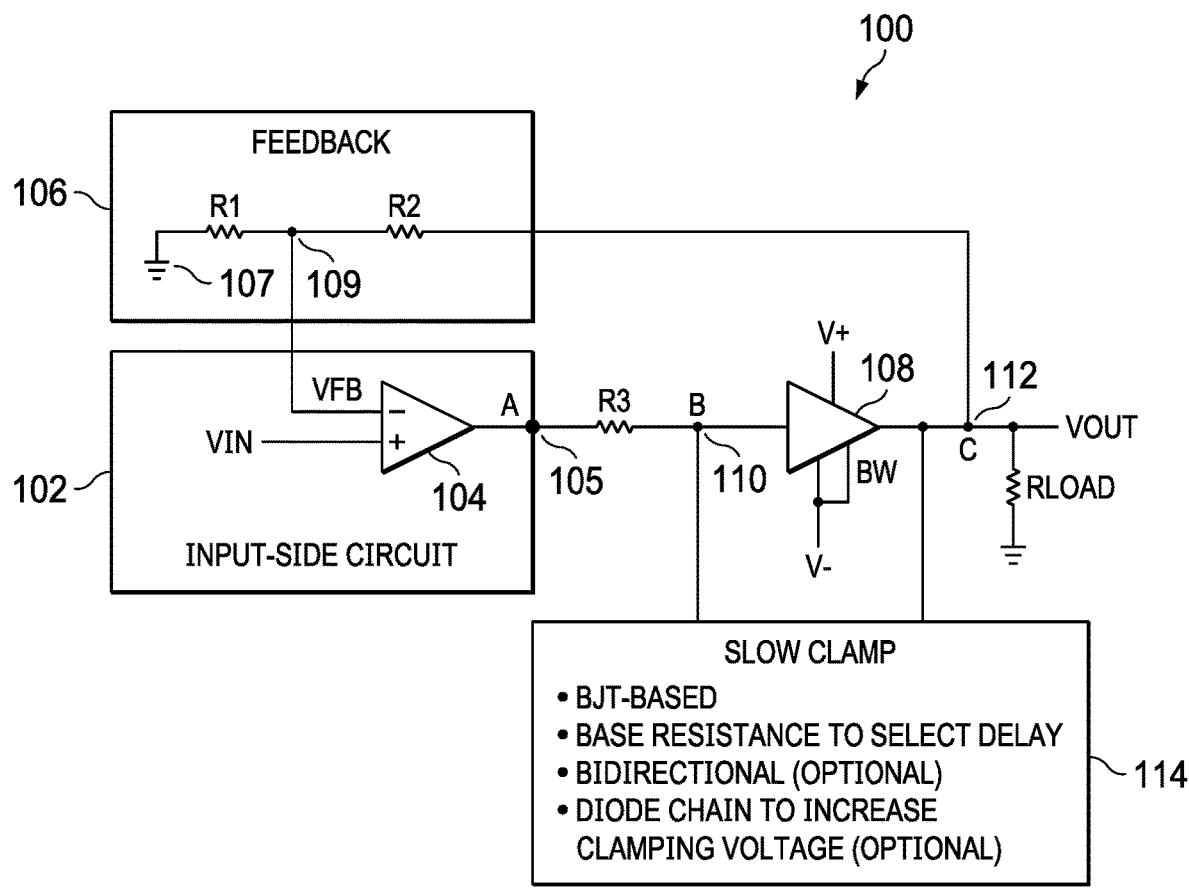
FIG. 1 is a diagram showing a system in accordance with some examples.

FIG. 1 is a diagram showing a system 100 in accordance with some examples. As shown, the system 100 includes a buffer circuit 108 with an input node 110 coupled to an input-side circuit 102 and with an output node 112 coupled to a load represented as a resistor (RLOAD). As shown, the buffer circuit 108 is powered using a positive supply voltage (V+) and a negative supply voltage (V−). The output node 112 of the buffer circuit 108 is coupled to the input-side circuit 102 via a feedback loop 106. In the example of FIG. 1, the feedback loop 106 includes resistors (R1 and R2) between a ground node 107 and the output node 112, where R1 and R2 form a voltage divider. Also, the input-side circuit 102 includes an operational amplifier 104 with an input voltage (VIN) as the positive input to the operational amplifier 104 and with a feedback voltage (VFB) as the negative input to the operational amplifier 104. In the example of FIG. 1, VFB is the voltage at the node 109 between R1 and R2. As shown, the input-side circuit 102 includes an output node 105 (labeled as an "A" node to facilitate comparison of different nodes in FIGS. 1-6).

In the example of FIG. 1, the system 100 also includes a slow clamp circuit 114 coupled between the input node 110 (labeled as a "B" node to facilitate comparison of different nodes in FIGS. 1-6) and the output node 112 (labeled as a "C" node to facilitate comparison of different nodes in FIGS. 1-6) of the buffer circuit 108. Also, a resistor (R3) is between the output node 105 of the input-side circuitry 102 and the input node 110. R3 is used to drop the extra voltage after the clamp kicks in and thus limit the clamping current from the input node 110. In some examples, R3 is an internal integrated circuit (IC) resistor included as part of the slow clamp circuit 114 or a buffer device (e.g., the buffer device 200 in FIG. 2) that includes the slow clamp circuit 114. In accordance with some examples, the slow clamp circuit 114 provides voltage clamping (the voltage differential between the input node 110 and the output node 112 of the buffer circuit 108 will be limited) with a design-based delay. With the design-based delay, the slow clamp circuit 114 clamping being after some delay (e.g., ~200 ns or more if a related buffer circuit delay is 100 ns or less), which allows fast slewing at the output node 112 while protecting against faults.

In some examples, the slow clamp circuit 114 uses a BJT with a base resistor to provide a design-based delay. The base resistor and the base-to-emitter capacitance of the BJT result in a clamping delay of at least a threshold amount of time (e.g., ~200 ns if a related buffer circuit delay is 100 ns or less). A diode is placed between the collector and emitter of the BJT to prevent reverse voltage, where the diode is able to withstand a large reverse voltage. In the example of FIG. 1, the slow clamp circuit 114 is used between the input node 110 and the output node 112 of the buffer circuit 108. In such case, the slow clamp circuit 114 does not interfere with the slew rate of fast changing input signals at the input node 110 of the buffer circuit 108. Under normal operating conditions, the signal at the output node 112 of the buffer circuit 108 will track the signal at the input node 110 of the buffer circuit 108 (the slow clamp circuit 114 does not interfere). If a fault condition arises, the signal at the output node 112 of the buffer circuit 108 will no longer track the signal at the input node 110 of the buffer circuit 108. Example fault conditions include the output node 112 being shorted to ground, a current limiter circuit becoming active, and a thermal shut down circuit becoming active.

In the event of a fault condition, the slow clamp circuit 114 is able to limit the difference between the voltage levels at the input node 110 and the output node 112, which limits reverse VBE across the off transistor of the buffer circuit 108. In this manner, the buffer circuit 108 is protected from damage due to reverse VBE. In different examples, the level of clamping provided by the slow clamping circuit 114 varies. Also, in different examples, the slow clamping circuit 114 provides unidirectional clamping or bidirectional clamping. Also, in some examples, protection diodes are added across the base and emitter terminals of each output transistor of the buffer circuit 108. Also, in different examples, the turn-on delay of a slow clamp circuit such as the slow clamping circuit 114 varies.

In other example systems, the components may vary from what is represented for the system 100 of FIG. 1. In some examples, the feedback circuit 106 is omitted or its components vary from the voltage divider (R1 and R2) represented in FIG. 1. Also, in some examples, the input-side circuit 102 is omitted or its components vary from the operational amplifier 104 represented in FIG. 1. Also, RLOAD varies for different examples.

In one example, a buffer circuit (e.g., the buffer circuit 108) and a slow clamp circuit (e.g., the slow clamp circuit 114) are used in a high-performance headphone driver application, where RLOAD corresponds to headphones or speakers. In such case, the feedback loop 106 and the input-side circuit 102 remain the same with an RC filter at the positive input of the operational amplifier 104. In another example, a buffer circuit (e.g., the buffer circuit 108) and a slow clamp circuit (e.g., the slow clamp circuit 114) are used in an automatic test equipment (ATE) scenario with other feedback loop components, input-side circuit components, and/or RLOAD components. In another example, a buffer circuit (e.g., the buffer circuit 108) and a slow clamp circuit (e.g., the slow clamp circuit 114) are used in a pseudo-ground driver scenario with other feedback loop components, input-side circuit components, and/or RLOAD components. In another example, a buffer circuit (e.g., the buffer circuit 108) and a slow clamp circuit (e.g., the slow clamp circuit 114) are used in current-output valve driver scenario with other feedback loop components, input-side circuit components, and/or RLOAD components. In another example, a buffer circuit (e.g., the buffer circuit 108) and a slow clamp circuit (e.g., the slow clamp circuit 114) are used in bridge-connected motor driver scenario with other feedback loop components, input-side circuit components, and/ or RLOAD components. In another example, a buffer circuit (e.g., the buffer circuit 108) and a slow clamp circuit (e.g., the slow clamp circuit 114) are used in an operational amplifier output current boosting scenario with other feedback loop components, input-side circuit components, and/ or RLOAD components.

Figure 2:
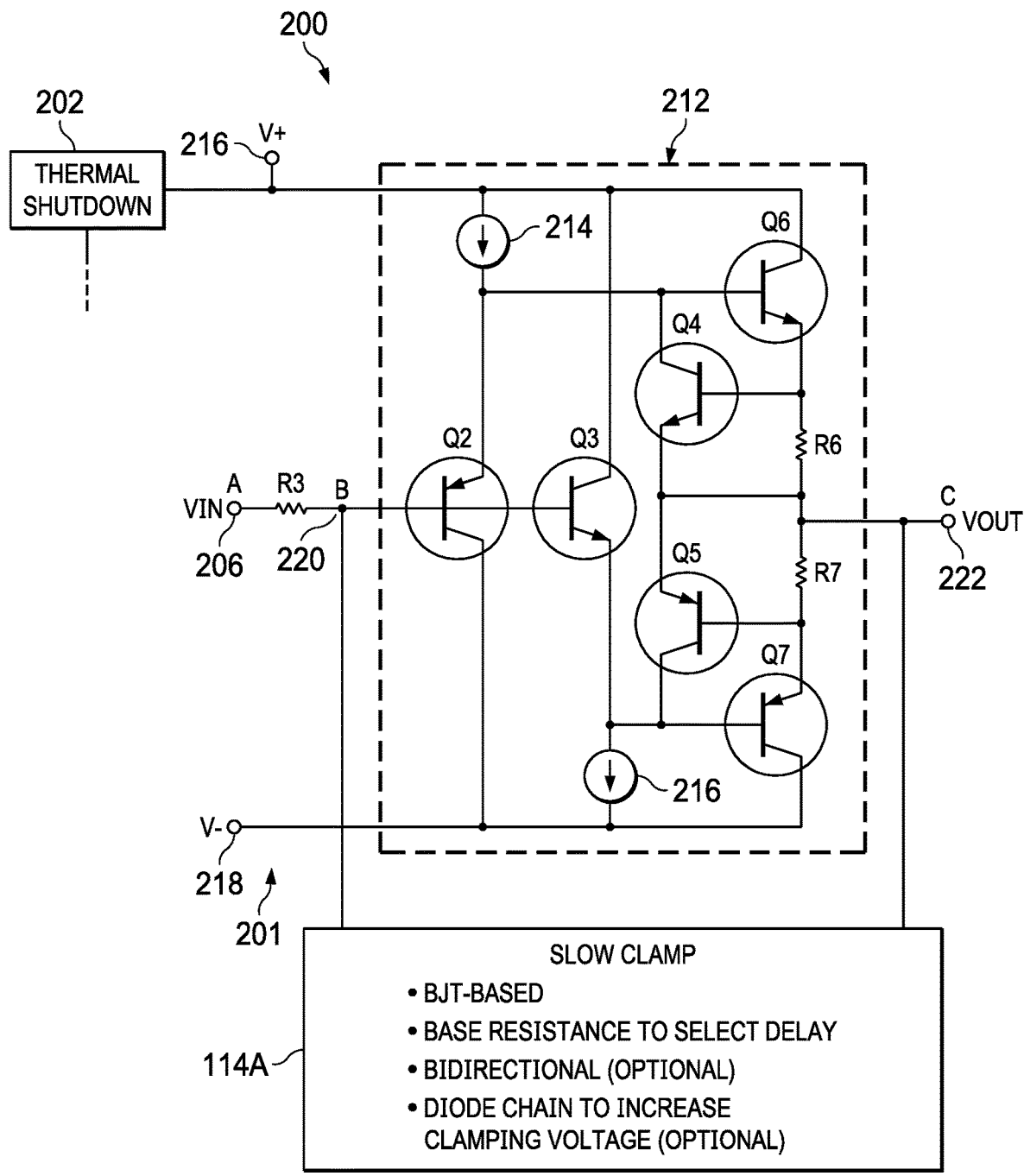
FIG. 2 is a diagram showing a buffer device with a slow clamp circuit in accordance with some examples.

FIG. 2 is a diagram showing a buffer device 200 (an example of the buffer circuit 108 in FIG. 1) with a slow clamp circuit 114A (an example of the slow clamp circuit in FIG. 1) in accordance with some examples. In the example of FIG. 2, the buffer device 200 includes a buffer circuit 212, a thermal shutdown circuit 202, and the slow clamp circuit 114A. As shown, a first end of the slow clamp circuit 114A is coupled to an input node (a "B" node) 220 (an example of the input node 110 in FIG. 1) of the buffer circuit 212, while a second end of the slow clamp circuit 114A is coupled to an output (VOUT) node (a "C" node) 222 (an example of the output node 112 in FIG. 1) of the buffer device 200. In some examples, the represented components of the buffer device 200 are components of a single integrated circuit (IC). In other examples, some of represented components of the buffer device 200 are external to the IC having the other components. For example, multiple ICs and/or use of discrete components to form the buffer device 200 is possible.

In the example of FIG. 2, the input node 220 is coupled to an external VIN node (an "A" node) 206 via R3. In some examples, the external VIN node 206 is coupled to the output of an input-side circuit (e.g., the output node 105 of the input-side circuit 102 in FIG. 1). As shown, the buffer circuit 212 includes current sources 214 and 216, various transistors (Q2-Q7), and resistors (R6, R7) in the arrangement shown. In operation, the buffer circuit 212 is configured to provide a VOUT with unity gain relative to VIN, where the current of VOUT is increased.

In some examples, the slow clamp circuit 114A of FIG. 2 uses a BJT with a base resistor to provide a design-based delay. The base resistor and the base-to-emitter capacitance of the BJT result in a clamping delay of at least a threshold amount of time (e.g., ~200 ns if a related buffer circuit delay is 100 ns or less). A diode is placed between the collector and emitter of the BJT to prevent reverse voltage, where the diode is able to withstand a large reverse voltage. In the example of FIG. 2, the slow clamp circuit 114A is used between the input node 220 and the output node 222 of the buffer circuit 212. In such case, the slow clamp circuit 114A does not interfere with the slew rate of fast changing input signals at the input node 220 of the buffer circuit 212. Under normal operating conditions, the signal at the output node 222 of the buffer circuit 212 will track the signal at the input node 220 of the buffer circuit 212 (the slow clamp circuit 114A does not interfere). If a fault condition arises, the signal at the output node 222 of the buffer circuit 212 will no longer track the signal at the input node 220 of the buffer circuit 212. Example fault conditions include the output node 212 being shorted to ground, a current limiter circuit becoming active, and the thermal shut down circuit 202 becoming active.

In the event of a fault condition, the slow clamp circuit 114A is able to limit the difference between the voltage levels at the input node 220 and the output node 222 of the buffer circuit 212, which limits reverse VBE across the off transistor (Q6) of the buffer circuit 212. In this manner, the buffer circuit 212 is protected from damage due to reverse VBE. In different examples, the level of clamping provided by the slow clamping circuit 114A varies. Also, in different examples, the slow clamping circuit 114A provides unidirectional clamping or bidirectional clamping. Also, in some examples, protection diodes (see e.g., D3 and D4 in FIG. 6) are added across the base and emitter terminals of each output transistor of a buffer circuit such as the buffer circuit 212. Also, in different examples, the turn-on delay of a slow clamp circuit 114A varies.

Figure 3:
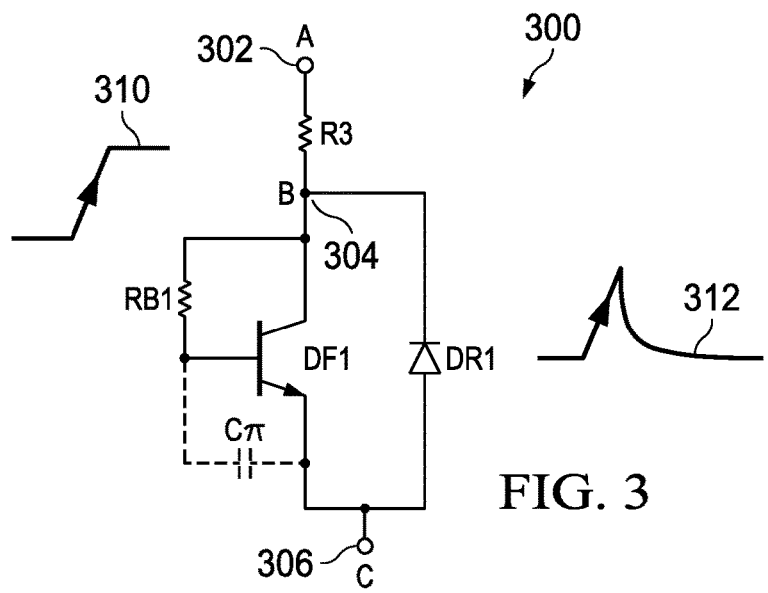
FIG. 3 is a schematic diagram showing a slow clamp circuit in accordance with some examples.

FIG. 3 is a schematic diagram showing a slow clamp circuit 300 (an example of the slow clamp circuit 114 in FIG. 1, or the slow clamp circuit 114A in FIG. 2) in accordance with some examples. As shown, the slow clamp circuit 300 includes a BJT (DF1) and a resistor (RB1) coupled between the base and collector terminals of DF1. In some example, the values of RB1 and Cu (the inherent capacitance between the base and emitter terminals of DF1) determine the delay time for the slow clamp circuit 300. This is because RB1 slows down the VBE of DF1. Also, because Cu is inherent to DF1, no external capacitor is needed, which saves area.

In the example of FIG. 3, a diode (DR1) is positioned between the emitter and collector terminals of DF1. More specifically, the anode of DR1 is coupled to the emitter terminal of DF1, and the cathode of DR1 is coupled to the collector terminal of DF1. In some examples, DF1 corresponds to an NPN device that is used as a diode in the forward direction. Also represented in FIG. 3 is a C node 306 at the emitter of DF1, a B node 304 at the collector of DF1, and an A node 302 separated from the B node 304 by R3. In FIG. 3, example signals 310 and 312 are also represented, where signal 310 is an example signal at the A node 302 and signal 312 is an example signal at the B node 304. For a fast-changing input at the A node 302, the VBE of DF1 rises slowly and the slow clamp circuit 300 remains open during a time-on delay (e.g., hundreds of nanoseconds). Thus, the slow clamp circuit 300 will act for slower inputs and does not hamper fast slews. For slower inputs, since the buffer output tracks the input, the slow clamp circuit 300 does not turn on. Accordingly, the slow clamp circuit 300 only works in case of fault conditions where the output does not track the input.

Figure 4:
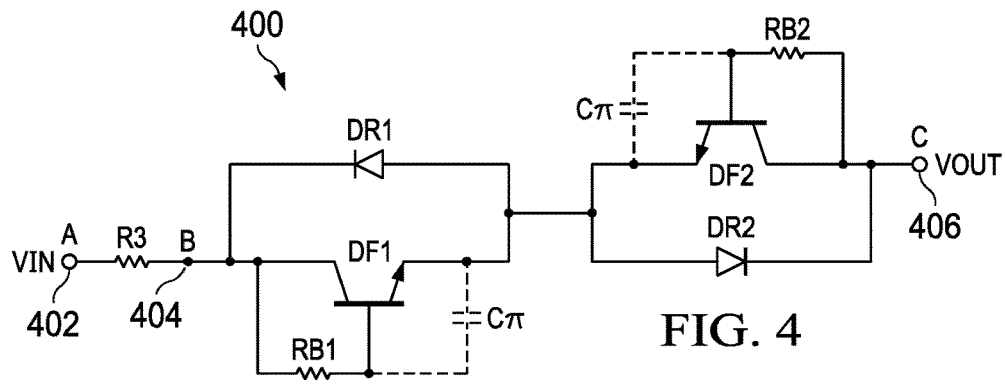
FIG. 4 is another schematic diagram showing a slow clamp circuit in accordance with some examples.

FIG. 4 is another schematic diagram showing a slow clamp circuit 400 in accordance with some examples. As shown, the slow clamp circuit 400 includes the same arrangement represented in FIG. 3, but with clamping in both directions (using back-to-back diodes DR1 and DR2). More specifically, the slow clamp circuit 400 includes DF1, RB1, and DR1 with the same arrangement relative to each other as described in FIG. 3. In addition, the slow clamp circuit 400 includes another BJT (DF2) with another base resistor (RB2), and another diode (DR2) across the emitter and collector terminals of DF2. In the example of FIG. 4, RB1 and $c\pi1$ determine the clamping delay related to DF1. Because $c\pi1$ increases with the clamp current, the delay increases as clamping related to DF1 starts acting. Similarly, RB2 and $c\pi2$ determine the clamping delay related to DF2. Because $c\pi2$ increases with the clamp current, the delay increases as clamping related to DF2 starts acting.

With the delay clamp circuit 400, an A node 402 (e.g., the VIN node 206 in FIG. 2), a B node 404 (e.g., the input node 220 in FIG. 2), and a C node 406 (e.g., the output node 222 in FIG. 2) are represented. As shown, R3 is coupled between the A node 402 and the B node 404. Also, DF2 and DR2 are mirrored related to DF1 and DR1 to provide clamping in both directions between the B node 404 and the C node 406. More specifically, the emitters of DF1 and DF2 are coupled together, and the anodes of DR1 and DR2 are coupled together, resulting in clamping in both directions between the B node 404 and the C node 406.

When the voltage at the B node 404 is higher than the voltage at the C node 406 (B>C is referred to as the +ve direction), DF1 conducts slowly along with DR2, which limits the reverse voltage across DF2. When the voltage at the C node 406 is higher than the voltage at the B node 404 (C>B is referred to as the −ve direction), DF2 conducts slowly along with DR1, which limits the drop across DF1. When the B node 404 goes transiently higher than the C node 406 (e.g., for 10s of ns), DF1 remains off and thus clamping is off for a short while. This slow clamping allows fast slewing of VOUT at the C node 406 without clamping effects. Similar behavior occurs when the C node 406 goes transiently higher than the B node 404 (e.g., for 10s of ns), except it is DF2 that remains off such that clamping is off for a short while. In some examples, DR1 and DR2 correspond to collector-base (CB) diodes. In the reverse direction, DR1 and DR2 are able to respectively withstand large reverse voltages, which appear when the slow clamp is still open.

Figure 5:
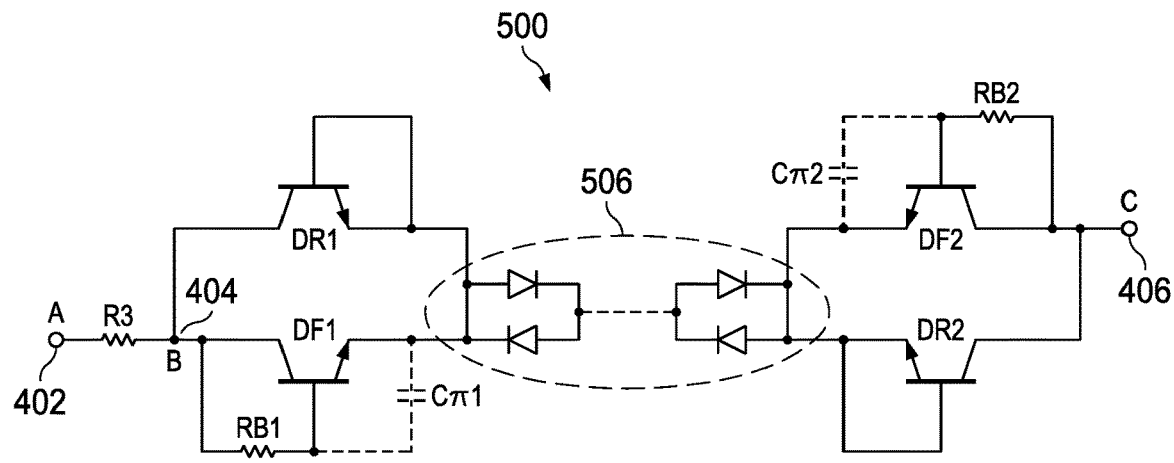
FIG. 5 is another schematic diagram showing a slow clamp circuit in accordance with some examples.

FIG. 5 is another schematic diagram showing a slow clamp circuit 500 in accordance with some examples. The slow clamp circuit 500 is similar to the slow clamp circuit 400, except an optional diode string 506 is added between the emitters of DF1 and DF2. Also, DR1 and DR2 in FIG. 5 are represented as collector-base (CB) diodes. By adding diodes to the diode string 506, the clamping voltage supported by the slow clamp circuit 500 is increased as desired.

Figure 6:
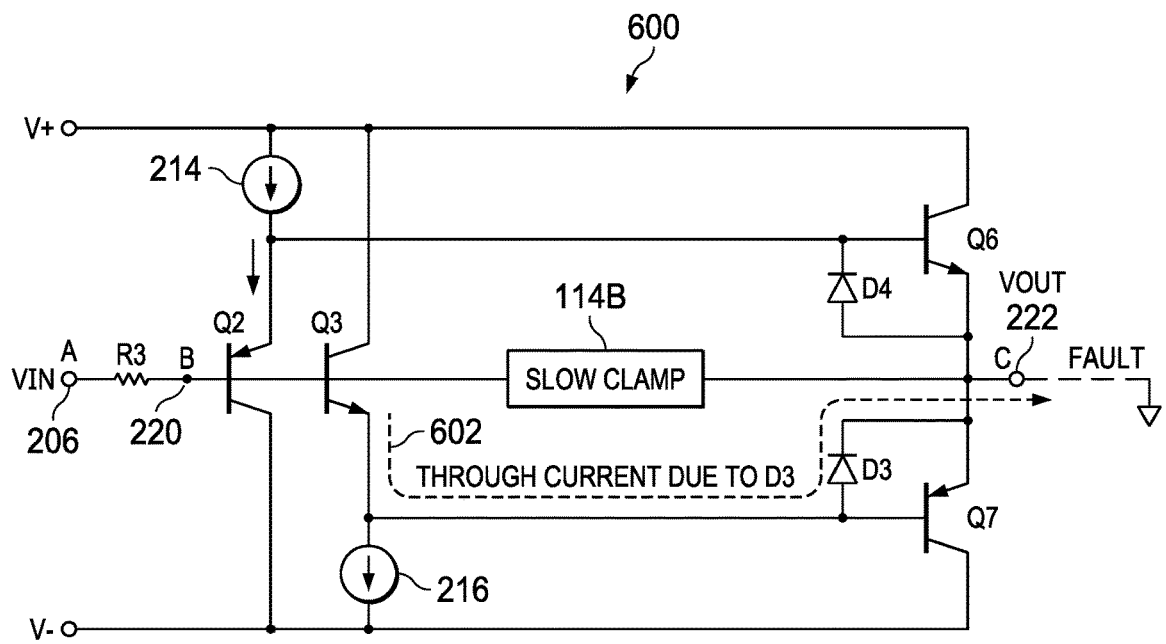
FIG. 6 is a schematic diagram showing a slow clamp circuit and base-to-emitter voltage (VBE) protection for a buffer circuit in accordance with some examples.

FIG. 6 is a schematic diagram showing a slow clamp circuit 114B (an example of the slow clamp circuit 114 in FIG. 1, the slow clamp circuit 300 in FIG. 3, the slow clamp circuit 400 in FIG. 4, or the slow clamp circuit 500 in FIG. 5) and VBE protection for a buffer circuit in accordance with some examples. In the example of FIG. 6, diodes (D3 and D4) are used for VBE protection at the output of a buffer circuit. In FIG. 6, various buffer circuit components corresponding to the buffer circuit 212 in FIG. 2 are represented including current sources 214 and 216, and transistors Q2, Q3, Q6, and Q7.

During fast transients, clamping provided by the slow clamp circuit 114B is not active yet, so reverse VBE stress occurs on Q6 and Q7 for a short period of time. To account for this stress issue, D3 is added across the base and emitter terminals of Q7. More specifically, the anode of D3 is coupled to the base terminal of Q7 and the cathode of D3 is coupled to the emitter terminal of Q7. Also, D4 is added across the base and emitter terminals of Q6. More specifically, the anode of D4 is coupled to the emitter terminal of Q6 and the cathode of D4 is coupled to the base terminal of Q6. With D3 and D4, the VBE will be forward biased and limited to ~0.7V.

Use of D3 and D4 alone does not resolve the reverse VBE issue due to a short circuit path (through current) being formed from the output of the previous stage (the through current is represented by the arrow 602). When D3 and D4 are used in combination with the slow clamp circuit 114B, the voltage at the input node 220 (B node) is pulled down after clamping turns on, which limits the through current 602.

Figure 7:
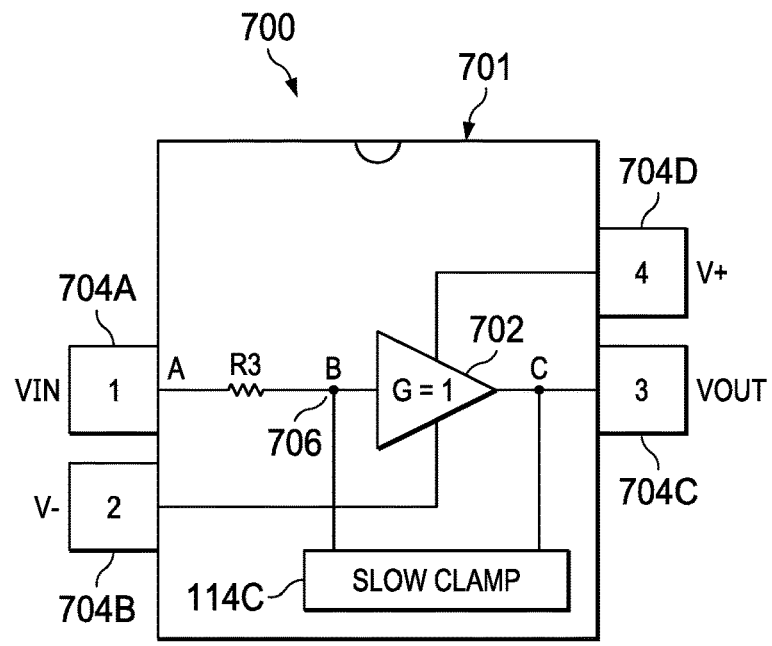
FIG. 7 is a diagram of a packaged integrated circuit in accordance with some examples.

FIG. 7 is a diagram of a packaged integrated circuit 700 in accordance with some examples. In the example of FIG. 7, the packed integrated circuit 700 corresponds to a buffer device with a unity-gain buffer circuit 702 (an example of the buffer circuit 212 in FIG. 2) based on a BJT architecture. As shown, a slow clamp circuit 114C (an example of the slow clamp circuit 114 in FIG. 1, the slow clamp circuit 300 in FIG. 3, the slow clamp circuit 400 in FIG. 4, or the slow clamp circuit 500 in FIG. 5) is coupled between the input and output of the unity-gain buffer circuit 702. In some examples, the unity-gain buffer circuit 702 and the slow clamp circuit 114C are on a single IC within a package 701. Also, the packaged integrated circuit 700 includes pins 704A-704D to couple the internal IC components to external components. In the example of FIG. 7, pin 704A is a VIN pin (e.g., coupled to the VIN node 206 in FIG. 2), which is an example of an A node herein. As shown, R3 and an internal B node 706 are represented as part of the packaged integrated circuit 700. Pin 704B is a V– pin (e.g., coupled to the V– node 218 in FIG. 2). Pin 704C is a VOUT pin (e.g., coupled to the output node 222 in FIG. 2), which is an example of a C node herein. Pin 704D is a V+ pin (e.g., coupled to the V+ node 216 in FIG. 2). In different examples, the packaging layout, the number of pins used, and/or the internal components of a packaged integrated circuit varies from what is represented in FIG. 7. For example, in different examples, components of an input-side circuit 102 and/or components of a feedback circuit 106 are included with the packaged integrated circuit 700.

Figure 8:
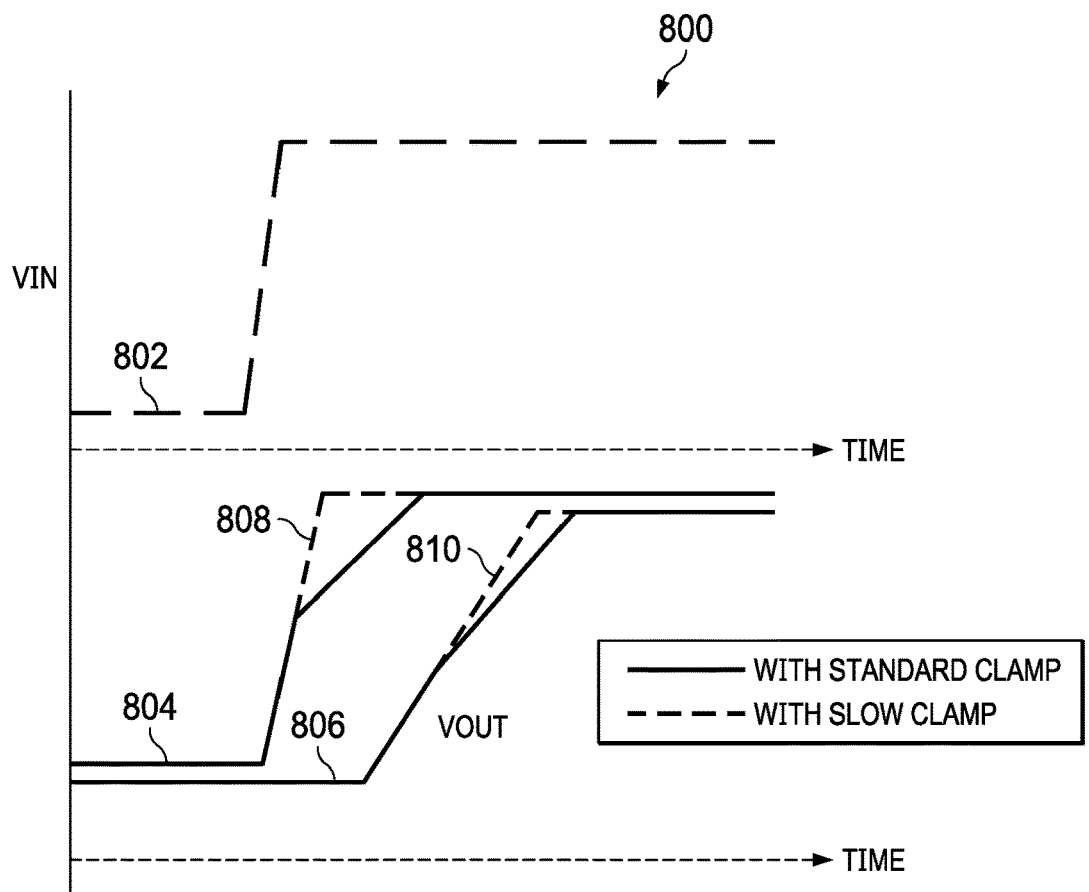
FIG. 8 is a timing diagram showing voltage waveforms as a function of time for a standard clamp circuit and a slow clamp circuit in accordance with some examples.

FIG. 8 is a timing diagram 800 showing voltage waveforms as a function of time for a standard clamp circuit and for a slow clamp circuit (e.g., the slow clamp circuit 114 in FIG. 1, the slow clamp circuit 300 in FIG. 3, the slow clamp circuit 400 in FIG. 4, or the slow clamp circuit 500 in FIG. 5) in accordance with some examples. In the timing diagram 800, a VIN waveform 802 is represented (e.g., the voltage at the VIN node 206 in FIG. 2, or any A node herein), where waveforms 804 and 806 are the result of the VIN waveform 802 being applied to a buffer circuit (e.g., the buffer circuit 212 in FIG. 2) with a standard clamp circuit, and where waveforms 808 and 810 are the result of the VIN waveform 802 being applied to a buffer circuit (e.g., the buffer circuit 212 in FIG. 2) with a slow clamp circuit. More specifically, the waveform 804 represents the voltage at the input of a buffer circuit (e.g., the voltage at the input node 220 in FIG. 2, or any B node herein) resulting from a standard clamp circuit. In contrast to waveform 804, the waveform 808 represents the voltage at the input of a buffer circuit (e.g., the voltage at the input node 220 in FIG. 2, or any B node herein) resulting from a slow clamp circuit. As represented by the waveforms 804 and 808, distortion at the input of a buffer circuit due to clamping is reduced by using a slow clamp circuit compared to using a standard buffer circuit. Also, the waveform 806 represents the voltage at the output of a buffer circuit (e.g., the voltage at the output node 222 in FIG. 2, or any C node herein) resulting from a standard clamp circuit. In contrast to waveform 806, the waveform 810 represents the voltage at the output of a buffer circuit (e.g., the voltage at the output node 222 in FIG. 2, or any C node herein) resulting from a slow clamp circuit. As represented by the waveforms 806 and 810, distortion at the output of a buffer circuit due to clamping is reduced by using a slow clamp circuit compared to using a standard buffer circuit. With a standard clamp circuit and a fast-changing VIN, the buffer input is distorted by clamping, which affects the VOUT slew. With a slow clamp circuit and a fast-changing VIN, the slow clamp circuit does not act in time to affect the buffer input, which allows VOUT to slew more quickly.

In some examples, a system (e.g., the system 100 in FIG. 1) includes a buffer circuit (e.g., the buffer circuit 108 in FIG. 1) and circuitry (e.g., the input-side circuit 102 and/or components of a feedback loop 106 in FIG. 1) coupled to an input of the buffer circuit. The system also includes a load (e.g., RLOAD in FIG. 1) coupled to an output of the buffer circuit. The system also includes a clamp circuit (e.g., the slow clamp circuit 114 in FIG. 1, the slow clamp circuit 114A in FIG. 2, the slow clamp circuit 300 in FIG. 3, the slow clamp circuit 400 in FIG. 4, or the slow clamp circuit 500 in FIG. 5) coupled between an input of the buffer circuit and the output of the buffer circuit, where the clamp circuit comprises a BJT (e.g., DF1 in FIG. 3) and a first resistor (e.g., RB1 in FIG. 3) with a first end coupled to a base terminal of the BJT and with a second end coupled to a collector terminal of the BJT. The clamp circuit also includes a second resistor (e.g., R3 herein) with a first end coupled to the collector terminal of the BJT and with a second end coupled to the input of the buffer circuit. The second resistor is between an output of the circuitry and the input of the buffer circuit. In some examples, the clamp circuit also includes a diode (e.g., DR1 in FIG. 3) having its anode coupled to an emitter terminal of the BJT and having its cathode coupled to the collector terminal of the BJT.

In some examples, the buffer circuit includes: 1) a first output BJT (e.g., Q6 in FIG. 2) with a collector terminal coupled to a positive voltage supply and with an emitter terminal coupled to the output of the buffer circuit; 2) a first diode (e.g., D4 in FIG. 6) with an anode coupled to the emitter terminal of the first output BJT and with a cathode coupled to a base terminal of the first output BJT; 3) a second output BJT (e.g., Q7 in FIG. 6) with a collector terminal coupled to a negative voltage supply and with an emitter terminal coupled to the output of the buffer circuit; and 4) a second diode (e.g., D3 in FIG. 6) with an anode coupled to a base terminal of the second output BJT and with a cathode coupled to an emitter terminal of the second output BJT.

In some examples, the clamp circuit is bidirectional (see e.g., FIG. 4), wherein the BJT is a first BJT, and wherein the clamp circuit includes a second BJT (e.g., DF2 in FIG. 4). In some examples, the clamp circuit includes a third resistor (e.g., RB2 in FIG. 4) coupled between a base terminal and a collector terminal of the second BJT (e.g., DF2 in FIG. 4). The clamp circuit also includes a diode (e.g., DR2 in FIG. 4) having its anode coupled to an emitter terminal of the second BJT and having its cathode coupled to the collector terminal of the second BJT. In some examples the clamp circuit includes a diode chain (e.g., the diode chain 506 in FIG. 5) between an emitter terminal of the first BJT and an emitter terminal of the second BJT. In some examples, the clamp circuit is configured to delay clamping for at least two times an input-to-output delay of the buffer circuit based on a value of the first resistor and a base-to-emitter capacitance (e.g., cπ in FIG. 3) of the BJT. Also, in some examples, the clamp circuit is configured to allow slew rates of at least 2000V/μs without clamping.

In some examples, a buffer device (e.g., an integrated circuit, a die, a packaged chip, or a multi-component module) includes an input node (e.g., the input node 220 in FIG. 2) and an output node (e.g., the output node 222 in FIG. 2). The buffer device also includes a buffer circuit (e.g., the buffer circuit 212 in FIG. 2) coupled between the input node and the output node. The buffer device also includes a clamp circuit (e.g., the clamp circuit 114A in FIG. 2) coupled between the input node and the output node of the buffer circuit, wherein the clamp circuit comprises: 1) a BJT (e.g., DF1 in FIG. 3); 2) a first resistor (e.g., RB1 in FIG. 3) with a first end coupled to a base terminal of the BJT and with a second end coupled to a collector terminal of the BJT; 3) and a second resistor (e.g., R3 herein) with a first end coupled to the collector terminal of the BJT and with a second end coupled to input node. The second resistor is between the input node (e.g., an A node herein) and an input (e.g., a B node herein) of the buffer circuit. In some examples, the clamp circuit also includes a diode (e.g., DR1 in FIG. 3) having its anode coupled to an emitter terminal of the BJT and having its cathode coupled to the collector terminal of the BJT.

In some examples, the buffer device includes: 1) a first output BJT with a collector terminal coupled to a positive voltage supply and with an emitter terminal coupled to the output node; 2) a first diode with an anode coupled to the emitter terminal of the first output BJT and with a cathode coupled to a base terminal of the first output BJT; 3) a second output BJT with a collector terminal coupled to a negative voltage supply and with an emitter terminal coupled to the output node; and 4) a second diode with an anode coupled to the base terminal of the second output BJT and with a cathode coupled to an emitter terminal of the second output BJT.

In some examples, the clamp circuit is bidirectional (see e.g., FIG. 4), wherein the BJT is a first BJT, and wherein the clamp circuit includes a second BJT (e.g., DF2 in FIG. 4). In some examples, the clamp circuit includes a third resistor (e.g., RB2 in FIG. 4) coupled between a base terminal and a collector terminal of the second BJT. The clamp circuit also includes a diode (e.g., DR2 in FIG. 4) having its anode coupled to an emitter terminal of the second BJT and having its cathode coupled to the collector terminal of the second BJT. In some examples, the clamp circuit comprises a diode chain (e.g., the diode chain 506 in FIG. 5) between an emitter terminal of the first BJT and an emitter terminal of the second BJT. In some examples, the clamp circuit is configured to delay clamping for at least two times an input-to-output delay of the buffer circuit based on a value of the first resistor and a base-to-emitter capacitance (cπ in FIG. 3) of the BJT. In some examples, the clamp circuit is configured to allow slew rates of at least 2000V/μs without clamping.

In some examples, an integrated circuit includes an input node (e.g., the input node 220 in FIG. 2) and an output node (e.g., the output node 222 in FIG. 2). The integrated circuit also includes buffer circuit (e.g., the buffer circuit 212 in FIG. 2, or the buffer circuit 702 in FIG. 7) coupled between the input node and the output node. The integrated circuit also includes a clamp circuit (e.g., the slow clamp circuit 114 in FIG. 1, the slow clamp circuit 114A in FIG. 2, the slow clamp circuit 300 in FIG. 3, the slow clamp circuit 400 in FIG. 4, or the slow clamp circuit 500 in FIG. 5) coupled between the input node and the output node, where the clamp circuit is configured to delay clamping for at least a threshold amount of time using a BJT (e.g., DF1 in FIG. 3) with a base resistor (e.g., RB1 in FIG. 3). In some examples, the clamp circuit also includes a diode (e.g., DR1 in FIG. 3) having its anode coupled to an emitter terminal of the BJT and having its cathode coupled to a collector terminal of the BJT. In some examples, the base resistor is a first resistor, and the clamp circuitry also includes: 1) a second resistor (e.g., R3 herein) with a first end coupled to the collector terminal of the BJT and with a second end coupled to the input node; and 2) a diode (e.g., DR1 in FIG. 3) having its anode coupled to an emitter terminal of the BJT and having its cathode coupled to the collector terminal of the BJT.

In some examples, the clamp circuit is bidirectional (see e.g., FIG. 4), wherein the BJT is a first BJT, and wherein the clamp circuit includes: 1) a second BJT (e.g., DF2 in FIG. 4); 2) a third resistor (e.g., RB2 in FIG. 4) coupled between a base terminal and the collector terminal of the second BJT; and 3) a diode (e.g., DR2 in FIG. 4) having its anode coupled to an emitter terminal of the second BJT and having its cathode coupled to a collector terminal of the second BJT. In some examples, the clamp circuit comprises a diode chain (e.g., the diode chain 506 in FIG. 5) between an emitter terminal of the first BJT and an emitter terminal of the second BJT. In some examples, the clamp circuit is configured to delay clamping for at least twice an input-to-output delay of the BJT buffer circuit based on a value of the base resistor (e.g., RB1 in FIG. 3) and a base-to-emitter capacitance (e.g., cπ in FIG. 3) of the BJT, and wherein the clamp circuit is configured to allow slew rates of at least 2000V/μs without clamping.

In contrast to older BJT processes that have a large reverse VBE rating (allowing a large clamping voltage) while protecting the device, modern high-speed BJT processes have much lower reverse VBE rating. Without slow clamp circuits as described herein, a standard diode clamp would severely limit slew rate. With slow BJT-based clamps (which allows the clamp to act after some delay) as described herein, fast slewing of the output is possible while still protecting against faults. In some examples, the disclosed slow clamp circuits use the inherent base-emitter capacitance of the BJT to reduce footprint. As desired, a symmetric (bidirectional) version of the clamp is possible. The proposed slow clamp circuit is usable with any unity gain BJT stage where reverse VBE rating can be an issue, or any application where a slow acting clamp is needed.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A system, comprising:
   a buffer circuit having an input and an output;
   an input amplifier having a first input coupled to an input voltage terminal, a second input coupled to the output of the buffer circuit, and an output coupled to the input of the buffer circuit; and
   a clamp circuit having a first terminal coupled to the input of the buffer circuit and a second terminal coupled to the output of the buffer circuit, wherein the clamp circuit includes:
      a clamp bipolar junction transistor (BJT) having a base terminal, a collector terminal and an emitter terminal;
      a first resistor having a first lead coupled to the base terminal of the clamp BJT and a second lead coupled to the collector terminal of the clamp BJT; and
      a second resistor having a first lead coupled to the collector terminal of the clamp BJT and a second lead coupled to the input of the buffer circuit and the output of the input amplifier.

2. The system of claim 1, wherein the clamp circuit also includes a diode having an anode coupled to the emitter terminal of the clamp BJT and a cathode coupled to the collector terminal of the clamp BJT.

3. The system of claim 1, wherein the buffer circuit includes:
   a first output BJT having a base terminal, a collector terminal coupled to a positive voltage supply and an emitter terminal coupled to the output of the buffer circuit;
   a first diode having an anode coupled to the emitter terminal of the first output BJT and a cathode coupled to the base terminal of the first output BJT;
   a second output BJT having a base terminal, a collector terminal coupled to a negative voltage supply and an emitter terminal coupled to the output of the buffer circuit; and
   a second diode having an anode coupled to a base terminal of the second output BJT and a cathode coupled to an emitter terminal of the second output BJT.

4. The system of claim 1, wherein the clamp circuit is bidirectional, the clamp BJT is a first clamp BJT, and the clamp circuit includes a second clamp BJT having a base terminal, a collector terminal and an emitter terminal.

5. The system of claim 4, wherein the clamp circuit includes:
   a third resistor having a first lead coupled to the base terminal of the second clamp BJT and a second lead coupled to the collector terminal of the second clamp BJT; and
   a diode having an anode coupled to the emitter terminal of the second clamp BJT and a cathode coupled to the collector terminal of the second clamp BJT.

6. The system of claim 4, wherein the clamp circuit includes a diode chain between the emitter terminal of the first clamp BJT and the emitter terminal of the second clamp BJT.

7. The system of claim 2, wherein the clamp circuit is configured to delay clamping for at least twice an input-to-output delay of the buffer circuit based on a value of the first resistor and a base-to-emitter capacitance of the first clamp BJT.

8. The system of claim 1, wherein the clamp circuit is configured to allow slew rates of at least 2000V/μs without clamping.

9. A device, comprising:
   an input terminal;
   an output terminal;
   a buffer circuit having an output coupled to the output terminal and having an input;
   an input amplifier having a first input coupled to the output of the buffer circuit, a second input coupled to the input terminal and an output coupled to the input of the buffer circuit;
   a clamp circuit having a first terminal coupled to the input of the buffer circuit and a second terminal coupled to the output of the buffer circuit, wherein the clamp circuit includes:
      a clamp bipolar junction transistor (BJT) having a base terminal, a collector terminal and an emitter terminal;
      a first resistor having a first lead coupled to the base terminal of the clamp BJT and a second lead coupled to the collector terminal of the clamp BJT; and
      a second resistor having a first lead coupled to the collector terminal of the clamp BJT and a second lead coupled to the input of the buffer circuit.

10. The buffer device of claim 9, wherein the clamp circuit also includes a diode having an anode coupled to the emitter terminal of the clamp BJT and a cathode coupled to the collector terminal of the clamp BJT.

11. The buffer device of claim 9, further including:
   a first output BJT having a base terminal, a collector terminal coupled to a positive voltage supply and an emitter terminal coupled to the output of the buffer circuit;
   a first diode having an anode coupled to the emitter terminal of the first output BJT and a cathode coupled to the base terminal of the first output BJT;
   a second output BJT having a base terminal, a collector terminal coupled to a negative voltage supply and an emitter terminal coupled to the output of the buffer circuit; and
   a second diode having an anode coupled to the base terminal of the second output BJT and a cathode coupled to the emitter terminal of the second output BJT.

12. The buffer device of claim 9, wherein the clamp circuit is bidirectional, the clamp BJT is a first clamp BJT, and the clamp circuit includes a second clamp BJT having a base terminal, a collector terminal and an emitter terminal.

13. The buffer device of claim 12, wherein the clamp circuit includes:
   a third resistor having a first lead coupled to the base terminal of the second clamp BJT and a second lead coupled to the collector terminal of the second clamp BJT; and
   a diode having an anode coupled to the emitter terminal of the second clamp BJT and a cathode coupled to the collector terminal of the second clamp BJT.

14. The buffer device of claim 12, wherein the clamp circuit includes a diode chain between the emitter terminal of the first clamp BJT and the emitter terminal of the second clamp BJT.

15. The buffer device of claim 10, wherein the clamp circuit is configured to delay clamping for at least twice an input-to-output delay of the buffer circuit based on a value of the first resistor and a base-to-emitter capacitance of the first clamp BJT.

16. The buffer device of claim 9, wherein the clamp circuit is configured to allow slew rates of at least 2000V/μs without clamping.

17. An integrated circuit, comprising:
   an input terminal;
   an output terminal;
   a bipolar junction transistor (BJT) buffer circuit having an output coupled to the output terminal and having an input;
   an input amplifier having a first input coupled to the output of the BJT buffer circuit, a second input coupled to the input terminal and an output coupled to the input of the BJT buffer circuit;
   a clamp circuit having a first terminal coupled to the input of the buffer circuit and a second terminal coupled to the output terminal, wherein the clamp circuit is configured to delay clamping for at least a threshold amount of time using a BJT having a base terminal coupled to a first lead of a base resistor, a collector terminal coupled to a second lead of the base resistor, and a collector terminal coupled to the output terminal.

18. The integrated circuit of claim 17, wherein the base resistor is a first resistor, and wherein the clamp circuit further includes:
   a second resistor with a first lead coupled to the collector terminal of the BJT and a second lead coupled to the output of the input amplifier; and
   a diode having an anode coupled to the emitter terminal of the BJT and having a cathode coupled to the collector terminal of the BJT.

19. The integrated circuit of claim 18, wherein the clamp circuit is bidirectional, the BJT is a first BJT, and the clamp circuit includes:
   a second BJT having a base terminal, a collector terminal and an emitter terminal;
   a third resistor coupled between the base terminal and the collector terminal of the second BJT; and
   a second diode having an anode coupled to the emitter terminal of the second BJT and a cathode coupled to the collector terminal of the second BJT.

20. The integrated circuit of claim 19, wherein the clamp circuit includes a diode chain between the emitter terminal of the first BJT and the emitter terminal of the second BJT.

21. The integrated circuit of claim 17, wherein the clamp circuit is configured to delay clamping for at least twice an input-to-output delay of the BJT buffer circuit based on a value of the base resistor and a base-to-emitter capacitance of the BJT, and wherein the clamp circuit is configured to allow slew rates of at least 2000V/μs without clamping.

* * * * *